(12) United States Patent
Schmid

(10) Patent No.: US 11,630,146 B1
(45) Date of Patent: Apr. 18, 2023

(54) TEST ARRANGEMENT FOR ADJUSTING A SETUP OF TESTING A DEVICE UNDER TEST, A METHOD OF OPERATING THE TEST ARRANGEMENT, AND A NON-TRANSITORY COMPUTER-READABLE RECORDING MEDIUM

(71) Applicant: Rohde & Schwarz GmbH & Co. KG, Munich (DE)

(72) Inventor: Simon Schmid, Mering (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 17/683,646

(22) Filed: Mar. 1, 2022

(51) Int. Cl.
  *G01R 31/28* (2006.01)
  *G01R 31/319* (2006.01)
  *G01R 31/317* (2006.01)
  *G01R 31/3181* (2006.01)

(52) U.S. Cl.
  CPC ..... *G01R 31/2822* (2013.01); *G01R 31/2884* (2013.01); *G01R 31/31721* (2013.01); *G01R 31/31813* (2013.01); *G01R 31/31908* (2013.01)

(58) Field of Classification Search
  CPC ............ G01R 31/2822; G01R 31/2884; G01R 31/31721; G01R 31/31813; G01R 31/31908
  USPC ........................................ 324/538, 537, 500
  See application file for complete search history.

(56) References Cited

U.S. PATENT DOCUMENTS

| | | | |
|---|---|---|---|
| 5,661,404 A | 8/1997 | Yanagawa et al. | |
| 9,535,150 B1 | 1/2017 | Lutz et al. | |
| 10,871,508 B1 * | 12/2020 | Roberts | G01R 1/24 |
| 10,884,046 B1 * | 1/2021 | Tsironis | H01P 5/04 |
| 2021/0143918 A1 * | 5/2021 | Schmid | H03F 1/3223 |

FOREIGN PATENT DOCUMENTS

| | | |
|---|---|---|
| CN | 105933034 B | 2/2019 |
| DE | 19525430 A1 | 2/1996 |

* cited by examiner

*Primary Examiner* — Giovanni Astacio-Oquendo
(74) *Attorney, Agent, or Firm* — Westman, Champlin & Koehler, P.A.

(57) ABSTRACT

A test arrangement for adjusting a setup of testing a device under test (DUT) includes a main device that generates an RF signal and processes an incoming RF signal in a first frequency range; a frontend component generates an RF signal and processes an incoming RF signal in a second frequency range. The frontend component measures a signal level in a sub-range within the first frequency range; a connection cable connects the main device with the frontend component; and an analyzer predicts a behavior of the connection cable in a rest portion of the first frequency range that is different from the sub-range within the first frequency range.

18 Claims, 5 Drawing Sheets

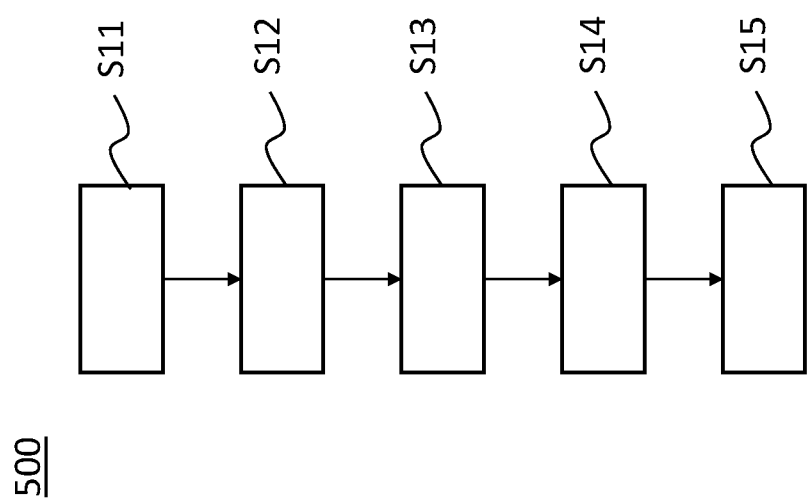

TEST ARRANGEMENT FOR ADJUSTING A SETUP OF TESTING A DEVICE UNDER TEST, A METHOD OF OPERATING THE TEST ARRANGEMENT, AND A NON-TRANSITORY COMPUTER-READABLE RECORDING MEDIUM

FIELD OF THE INVENTION

The present invention relates to a test arrangement for adjusting a setup of testing a device under test, a method of operating the test arrangement. The invention further relates to a non-transitory computer-readable recording medium.

TECHNICAL BACKGROUND

Traditionally, measurement devices are implemented as a "one box" solution and connected to the device under test (DUT) with a signal cable. With increasing frequencies, the signal cable to the DUT leads to increasing impairments due to its attenuation. The insertion loss (IL) of a typical cable is already over 6 dB at 70 GHz and thus significantly reduces the dynamic range and/or input level at the DUT. Recently, the measurement devices operating at the bands above 100 GHz has been developed.

Meanwhile, in order to eliminate the influence of the signal cable connecting the measurement device and the DUT, frontends have been adopted to contain the highest frequency part of the signal chain, and located directly at the DUT. This is why so-called front ends will play a crucial role, while the frontend is firmly bound to the main device. This structure can apply to the multipliers of signal generators or the mixers of spectrum analyzers. While current frontends mainly represent a narrowband frequency extension, future frontends will have to support the full range of functions and frequency range. This setup is valid for both transmitter and receiver arrangement.

With adding the frontend, the whole frequency range covered by the measurement device can be extended. For example, the main device provides the frequency range from F0 to F1, the frontend expands the frequency range by F1 to F2. F0 to F2 are then available at the connector of the frontend.

However, this setup still needs a connection cable between a main device and the frontend. More specifically, the level measuring point integrated in the frontend only covers the range F1' . . . F2, but not the entire frequency range. For the range F0 . . . F1', the setup must be characterized by external comparison in production and is therefore unchangeable, or the customer needs additional equipment. Or a known and characterized cable is prescribed for the connection. Both solutions result in the available level range not being able to be used (fixed cable) or in the customer's effort being high (alignments).

According to a prior art, a customer of the measurement device cannot change, adjust, or correct the setup of testing the DUT by themselves, even when it is required to change the connection cable due to aging, temperature variations, or defects.

Therefore, it is desired to develop a measurement setup that can be optimized flexibly by a customer in a robust manner.

SUMMARY OF THE INVENTION

Against this background, there is the need to provide a test arrangement for adjusting a setup for testing a device under test.

Accordingly, the present disclosure provides a test arrangement for adjusting a setup of testing a device under test, a method of operating the test arrangement and a non-transitory computer-readable recording medium having the features of the independent claims.

According to a first aspect of the present disclosure, a test arrangement for adjusting a setup of testing a device under test (DUT) is provided. The test arrangement comprises: a main device configured to generate a RF signal and process an incoming RF signal in a first frequency range; a frontend component configured to generate a RF signal and process an incoming RF signal in a second frequency range such to perform a test on the DUT throughout the first and second frequency ranges, wherein the frontend component is configured to measure a signal level in a sub-range within the first frequency range; a connection cable for connecting the main device with the frontend component to transmit the RF signal generated by the main device in the first frequency range to the frontend component; and an analyzer integrated in or connected to the frontend component, wherein the analyzer is configured to predict a behavior of the connection cable in a rest portion of the first frequency range different from the sub-range within the first frequency range, based on the measured signal level of the sub-range.

According to a second aspect of the present disclosure, a method of operating a test arrangement for adjusting a setup of testing a device under test (DUT) is provided. The method comprises: providing a main device configured to generate a RF signal and process an incoming RF signal in a first frequency range; providing a frontend component configured to generate a RF signal and process an incoming RF signal in a second frequency range such to perform a test on the DUT throughout the first and second frequency ranges; measuring, by the frontend component, a signal level in a sub-range within the first frequency range that is transmitted via a connection cable for connecting the main device with the frontend component; predicting, by an analyzer integrated in or connected to the frontend component, a behavior of the connection cable in a rest portion of the first frequency range different from the sub-range within the first frequency range, based on the measured signal level of the sub-range; and displaying, by a user interface, a prediction result of the behavior of the connection cable.

According to a third aspect of the present disclosure, a non-transitory computer-readable recording medium storing instructions executable by a computer processor, causing the computer processor to execute a method of operating a test arrangement for adjusting a setup for testing device under test is provided. The instruction comprises: providing a main device configured to generate a RF signal and process an incoming RF signal in a first frequency range; providing a frontend component configured to generate a RF signal and process an incoming RF signal in a second frequency range such to perform a test on the DUT throughout the first and second frequency ranges; measuring, by the frontend component, a signal level in a sub-range within the first frequency range that is transmitted via a connection cable for connecting the main device with the frontend component; predicting, by an analyzer integrated in or connected to the frontend component, a behavior of the connection cable in a rest portion of the first frequency range different from the sub-range within the first frequency range, based on the measured signal level of the sub-range; and displaying, by a user interface, a prediction result of the behavior of the connection cable.

The present invention is based on the knowledge that the properties of connection cable between the main device and the frontend component in at least a part of operating frequency range of the main device can be characterized only by external comparison using an additional apparatus, and that the frontend component is capable of measure the signal at least another part of the operating frequency range of the main device.

Also, the present invention is based on the idea to predict characteristics of connection cable using modeling, in particular using an artificial intelligence model, in unmeasured frequency range.

More specifically, there is an RF cable as a connection between the main device and the frontend. The level measuring point in the frontend only covers a limited frequency range (F1' . . . F1). In the frequency range F0 . . . F1', the behaviour of the connection cable would currently have to be determined externally. In the invention, instead, the properties of the cable are only determined in the range F1' to F1 (the setup can do this independently by means of internal adjustments) and transferred to a mathematical model. The model describes the properties of the cable in the range f<F1' and is used for correction in this range. This enables the customer to use any cable of any length that is suitable in the frequency range and still achieve very high level accuracy/measurement accuracy without having to laboriously adjust the setup or being restricted in the choice of connection cable. In addition, the properties of the setup (e.g. output level) can be adapted to the requirements by using the shortest possible cable Advantageous configurations and developments emerge from the further dependent claims and from the description with reference to the figures of the drawings.

According to an embodiment of the present disclosure, the analyzer may be a part of the frontend component. By configuring the analyzer as a part of the frontend component, the customer does not need to prepare additional device to measure the properties of connection cable.

According to an embodiment of the present disclosure, the second frequency range is higher than the first frequency range. The second frequency range starts from an upper boundary of the first frequency range, such to extend the continuous frequency range. The first frequency range and the second frequency range may be exclusive to each other. However, the first and second frequency ranges may not be limited thereto. For example, the first frequency range and the second frequency range may have overlapped frequency range.

According to an embodiment of the present disclosure, the sub-range within the first frequency range is higher range than the rest portion of the first frequency range. For example, the sub-range may be an upper portion of the first frequency range.

According to an embodiment of the present disclosure, the analyzer includes a prediction model for determining the behavior of the connection cable, the prediction model is artificial intelligence model fed with the measured signal level of the sub-range within the first frequency range.

According to an embodiment of the present disclosure, the prediction model is configured to predict an attenuation rate of signal in the rest portion of the first frequency range. For example, the prediction model is a digital model.

According to an embodiment of the present disclosure, the prediction model is trained over time based on the measured signal level of the sub-range repeatedly.

According to an embodiment of the present disclosure, the test arrangement further comprises a user interface coupled to the analyzer, wherein the user interface comprises an input terminal for receiving a user input, wherein the user interface is configured to display a prediction result of the behavior of the connection cable.

According to an embodiment of the present disclosure, the prediction result includes at least one of:
an indication indicating whether the connection cable has a defect;
an indication indicating whether the connection cable is properly installed;
an indication indicating whether the connection cable satisfies predefined requirements to be operated;
information on specification of an alternative connection cable; and
an estimated accuracy rate of the prediction.

According to an embodiment of the present disclosure, the user input includes a desired performance of the connection cable.

According to an embodiment of the present disclosure, the prediction result further includes a rate of how much the connection cable fits to the desired performance.

According to an embodiment of the present disclosure, the user input includes information of the sub-range within the first frequency range.

According to an embodiment of the present disclosure, the frontend component is further configured to correct a configuration of the main device based on the prediction result.

According to an embodiment of the present disclosure, the configuration of the main device includes at least one of a frequency, a phase, and an output power level of the main device.

According to an embodiment of the present disclosure, the test arrangement further comprises: a database coupled to the analyzer for storing a plurality of connection cables and corresponding specifications of the plurality of connection cables.

Where appropriate, the above-mentioned configurations and developments can be combined in any manner. Further possible configurations, developments and implementations of the invention also include combinations, which are not explicitly mentioned, of features of the invention which have been described previously or are described in the following with reference to the embodiments. In particular, in this case, a person skilled in the art will also add individual aspects as improvements or supplements to the basic form of the present invention.

CONTENT OF THE DRAWINGS

The present invention is described in greater detail in the following on the basis of the embodiments shown in the schematic figures of the drawings, in which:

FIG. 5 is a flow chart illustrating a method of operating a test arrangement for adjusting a setup of testing a device under test according to the present disclosure.

Figure 1:
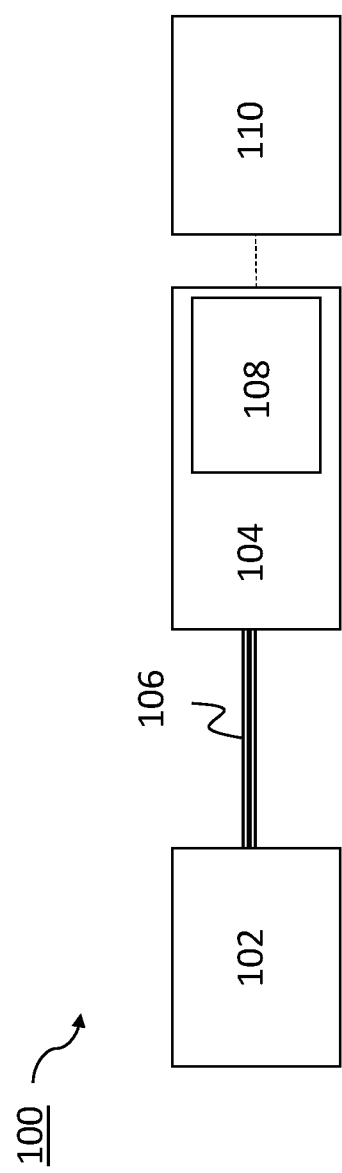
FIG. 1 shows a schematic diagram of a test arrangement 100 for adjusting a setup of testing a device under test (DUT) according to an embodiment of the present disclosure.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

DESCRIPTION OF EMBODIMENTS

FIG. 1 shows a schematic diagram of a test arrangement 100 for adjusting a setup of testing a device under test (DUT) according to an embodiment of the present disclosure.

As shown in FIG. 1, the test arrangement 100 includes a main device 102, a frontend component 104, a connection cable 106, and an analyzer 108. The test arrangement 100 may further comprise a device under test 110.

The main device 102 is configured to perform a measurement on the DUT 110. The main device 102 operates in a first frequency range. More specifically, the main device 102 is configured to generate a RF signal for testing the DUT 108 or process an incoming RF signal received from the DUT 108, within the first frequency range.

The frontend component 104 is configured to perform a measurement on the DUT 110. The frontend component 104 operates in a second frequency range. More specifically, the frontend component 104 is configured to generate a RF signal for testing the DUT 110 or process an incoming RF signal received from the DUT 108, within the second frequency range.

The frontend component 104 is configured to extend operating frequency range of the test arrangement. The first frequency range and the second frequency range may be defined to expand a continuous frequency range that the test arrangement can operate.

The first frequency range and the second frequency range may be exclusive to each other. However, the first and second frequency ranges may not be limited thereto. For example, the first frequency range and the second frequency range may have overlapped frequency range. According to an embodiment of the present disclosure, the second frequency range is higher than the first frequency range. The second frequency range starts from an upper boundary of the first frequency range, such to extend the continuous frequency range.

The frontend component 104 may configured to route signals associated with the main device 102. For example, the frontend component 104 may deliver RF signal received from the DUT 108 in the first frequency range to the main device 102, or deliver RF signal generated by the main device 102 to the DUT 110 through its signal path.

The frontend component 104 may be located as close as possible to the DUT 110. For example, the frontend component 104 may be located at a DUT 110 side in order to eliminate signal loss that can be occurred in a signal cable.

The frontend component 104 may be configured to microwaves.

The frontend component 104 is configured to measure a signal level in a sub-range within the first frequency range. It is allowed for the frontend component 104 to measure signal level of a narrow bandwidth within the first frequency range. The sub-range may be an upper portion of the first frequency range. That is, the sub-range may be higher than a rest portion of the first frequency range. More specifically, the sub-range starts from a certain frequency point in the first frequency range and lasts until the upper boundary of the first frequency range.

The connection cable 106 is configured to connect the main device 102 with the frontend component 104. The sub-range within the first frequency range is transmitted via the connection cable 106. The frontend component 104 is configured to measure the signal level of the sub-range of the first frequency that is delivered from the main device 102 through the connection cable 106. Therefore, the measured signal level of the sub-range of first frequency range reflects the characteristics of the connection cable 106.

The behaviour of the connection cable 106 may include an attenuation of signal depending on frequency range.

The analyzer 108 is configured to predict a behaviour of the connection cable 106 in a rest portion of the first frequency range that is different from the sub-range within the first frequency range, based on the measured signal level of the sub-range.

The analyser 108 is coupled to the frontend component 104. As shown FIG. 1, the analyser 108 may be a part of the frontend component 104. However, the analyser 108 may be implemented as a separate device from the frontend component 104.

The analyser 108 may include a prediction model for determining the behaviour of the connection cable 106. The prediction model may be an artificial intelligence model fed with the measured signal level of the sub-range of the first frequency range. That is, the prediction model is used to predict the behaviour of the connection cable 106 in a rest portion of the first frequency range, e.g. unmeasured part of the first frequency range, based on the sub-range of the first frequency range, e.g. measured part of the first frequency range.

The prediction model may be configured to predict an attenuation rate (e.g. insertion loss, IL, of connection cable) of signal in the rest portion of the first frequency range. The analyser 108 is capable of determining whether the attenuation rate of signal in the rest portion of the first frequency satisfies requirements of the test arrangement 100 to be operated. The prediction model may be a digital model.

The prediction model is defined with respect to a plurality of parameters for describing the connection cable 106.

For example, the prediction is executed in following sequence:
  Step 1: fitting a straight line to insertion loss (IL) of signal in measured frequency range, e.g. sub-range;
  Step 2: calculating delta (differential) of the IL of signal in the measured frequency range, e.g. sub-range;
  Step 3: estimating IL of signal in unmeasured frequency range, e.g. rest portion of the first frequency range, based on two equations depending on its frequency range within the unmeasured frequency range, based on the delta value calculated in step 2.

Figure 4:
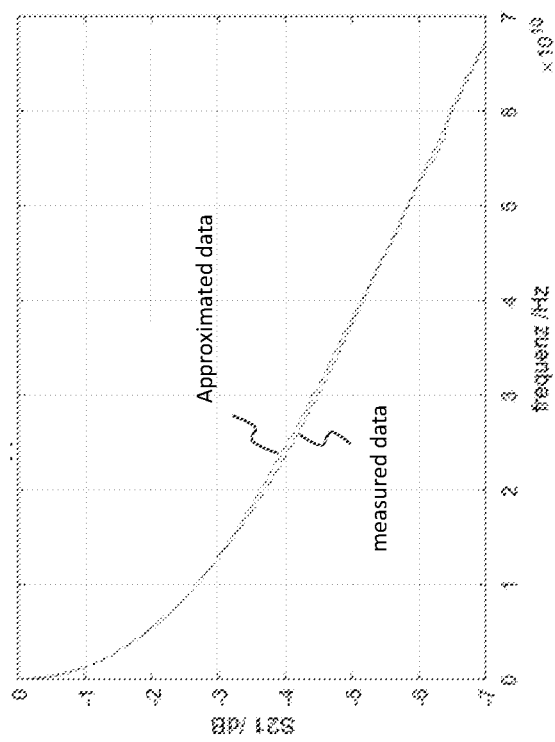
FIG. 4 is a simulated result of prediction of insertion loss (IL) of the connection cable according to an embodiment of the present disclosure.

More detailed manner of using prediction model is described with FIG. 4.

The analyser 108 is configured to train the prediction model to achieve enhanced accuracy of the prediction result. For example, the prediction model is trained using measurement data, reference data, connection cables from other manufacturer. The analyser 108 may receive input from user to develop the prediction model, for example, additional parameters and further input data.

The analyser 108 may be configured to determine whether the connection cable 108 is properly installed based on the measured signal level of the sub-range within the first frequency range. If unusual pattern of signal level is measured, the analyser 108 may determine that the connection cable 106 is not well installed.

The analyser 108 may be further configured to determine whether the connection cable satisfies predefined requirements to be operated based on at least one of measured signal level of sub-range of first frequency range and predicted behaviour of connection cable. The predefined requirements to be operated of the connection cable may be least requirements that enables to operate the test arrangement, or a requirements defined by a user.

The analyser 108 may be further configured to determine an alternative connection cable based on at least one of measured signal level of sub-range of first frequency range and predicted behaviour of connection cable. For example, the analyser 108 may determine the alternative connection cable based on the requirements of the connection cable 106, depending on at least one of measured signal level of sub-range of first frequency range and predicted behaviour of connection cable.

The analyser 108 may be further configured to estimate accuracy rate of the prediction. For example, the analyser 108 may collect information of proceeding predictions and user's feedback.

According to an embodiment of the present disclosure, the prediction model is trained over time based on the measured signal level of the sub-range repeatedly. The sub-range within the first frequency range can be varied in each repetition based on user input, or predefined algorithm.

According to an embodiment of the present disclosure, the test arrangement 100 may further includes user interface (not shown) coupled to the analyser 108. The user interface may be also configured to be a part of the frontend component 104.

The user interface comprises an input terminal for receiving a user input. The user interface is configured to display a prediction result of the behaviour of the connection cable 106.

The prediction result may include at least one of:
an indication indicating whether the connection cable has a defect;
an indication indicating whether the connection cable is properly installed;
an indication indicating whether the connection cable satisfies predefined requirements to be operated;
information on specification of an alternative connection cable; and
an estimated accuracy rate of the prediction.

The user input may include a desired performance of the connection cable 104. The prediction result may further include a rate of how much the connection cable fits to the desired performance.

The user input may further include information of the sub-range within the first frequency range. That is, the sub-range of the first frequency range may be defined by the user.

The frontend component 104 may be further configured to correct configurations of the main device 102 based on at least one of measured signal level of sub-range of first frequency range and predicted behaviour of connection cable. The configurations of the main device 102 may include at least one of a frequency, a phase, and an output power level of the main device 102. That is, the analyzer 108 is capable of optimizing configuration of the main device 102 to perform the measurement on DUT 110 efficiently and accurately.

The test arrangement 100 may further comprise a database coupled to the analyser 108 for storing a plurality of connection cables and corresponding specifications of the plurality of the connection cables 104. By using the stored data, the analyser may recommend alternative connection cables depending on the requirements.

According to embodiments of the present disclosure, the users may adjust, by themselves, the setup of the test arrangement efficiently without external analyzations using additional apparatus. In addition, the user can easily recognize whether the connection cable is suitable for testing the DUT, if not, the user can collect information on the alternative connection cables. Furthermore, the user can easily recognize whether the connection cable is duly installed.

Figure 2:
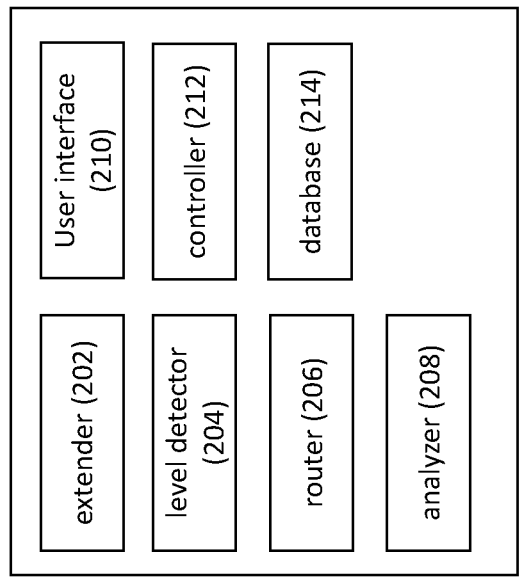
FIG. 2 is a schematic diagram of the frontend component 104 according to an embodiment of the present disclosure.

FIG. 2 is a schematic diagram of the frontend component 104 according to an embodiment of the present disclosure.

As shown in FIG. 2, the frontend component 104 may include an extender 202, a level detector 204, router 206, analyser 208, a user interface 210, a controller 212, and a database 214. The frontend component may further include an input terminal and an output terminal for receiving and transmitting RF signals.

The extender 202 is configured to generate a RF signal for testing the DUT 110 or process an incoming RF signal received from the DUT 108, within the second frequency range. The extender 202 may be a power extender.

The level detector 204 is configured to measure a signal level in a sub-range within the first frequency range. It is allowed for the level detector 204 to measure signal level of a narrow bandwidth within the first frequency range.

The router 206 may configured to route signals associated with the main device 102. For example, the router 206 may deliver RF signal received from the DUT 108 in the first frequency range to the main device 102, or deliver RF signal generated by the main device 102 to the DUT 110 through its signal path.

The analyzer 208 is configured to predict a behaviour of the connection cable 106 in a rest portion of the first frequency range that is different from the sub-range within the first frequency range, based on the measured signal level of the sub-range.

The analyser 208 may include a prediction model for determining the behaviour of the connection cable 106. The prediction model may be an artificial intelligence model fed with the measured signal level of the sub-range of the first frequency range. That is, the prediction model is used to predict the behaviour of the connection cable 106 in a rest portion of the first frequency range, e.g. unmeasured part of the first frequency range, based on the sub-range of the first frequency range, e.g. measured part of the first frequency range.

The prediction model may be configured to predict an attenuation rate (e.g. insertion loss, IL, of the connection cable) of signal in the rest portion of the first frequency range. The analyser 208 is capable of determining whether the attenuation rate of signal in the rest portion of the first frequency satisfies requirements of the test arrangement 100 to be operated. The prediction model may be a digital model.

The analyser 208 may be configured to determine whether the connection cable 106 is properly installed based on the measured signal level of the sub-range within the first frequency range. If unusual pattern of signal level is measured, the analyser 208 may determine that the connection cable 106 is not well installed.

The analyser 208 may be further configured to determine whether the connection cable satisfies predefined requirements to be operated based on at least one of measured signal level of sub-range of first frequency range and predicted behaviour of connection cable. The predefined requirements to be operated of the connection cable may be least requirements that enables to operate the test arrangement, or a requirements defined by a user.

The analyser 208 may be further configured to determine an alternative connection cable based on at least one of measured signal level of sub-range of first frequency range and predicted behaviour of connection cable. For example, the analyser 208 may determine the alternative connection cable based on the requirements of the connection cable 206, depending on at least one of measured signal level of sub-range of first frequency range and predicted behaviour of connection cable.

The analyser 208 may be further configured to estimate accuracy rate of the prediction. For example, the analyser 108 may collect information of proceeding predictions and user's feedback.

The user interface 210 comprises an input terminal for receiving a user input. The user interface 210 is configured to display a prediction result of the behaviour of the connection cable 106.

The prediction result may include at least one of:
- an indication indicating whether the connection cable has a defect;
- an indication indicating whether the connection cable is properly installed;
- an indication indicating whether the connection cable satisfies predefined requirements to be operated;
- information on specification of an alternative connection cable; and
- an estimated accuracy rate of the prediction.

The user interface 210 may be configured to receive a desired performance of the connection cable 104 from the user. The prediction result may further include a rate of how much the connection cable fits to the desired performance.

The user interface 210 may be configured to receive information of the sub-range within the first frequency range from the user. That is, the sub-range of the first frequency range may be defined by the user.

The controller 212 may be further configured to correct configurations of the main device 102 based on at least one of measured signal level of sub-range of first frequency range and predicted behaviour of connection cable. The configurations of the main device 102 may include at least one of a frequency, a phase, and an output power level of the main device 102. That is, the controller 212 is capable of optimizing configuration of the main device 102 to perform the measurement on DUT 110 efficiently and accurately.

The database 214 is configured to store a plurality of connection cables and corresponding specifications of the plurality of the connection cables 104. By using the stored data, the analyser may recommend alternative connection cables depending on the requirements.

According to embodiments of the present disclosure, the users may adjust, by themselves, the setup of the test arrangement efficiently without external analyzations using additional apparatus. In addition, the user can easily recognize whether the connection cable is suitable for testing the DUT, if not, the user can collect information on the alternative connection cables. Furthermore, the user can easily recognize whether the connection cable is duly installed.

However, as already described above, some elements of the frontend component 104 described in FIG. 2 may be configured as separate component from the frontend component 104.

Figure 3:
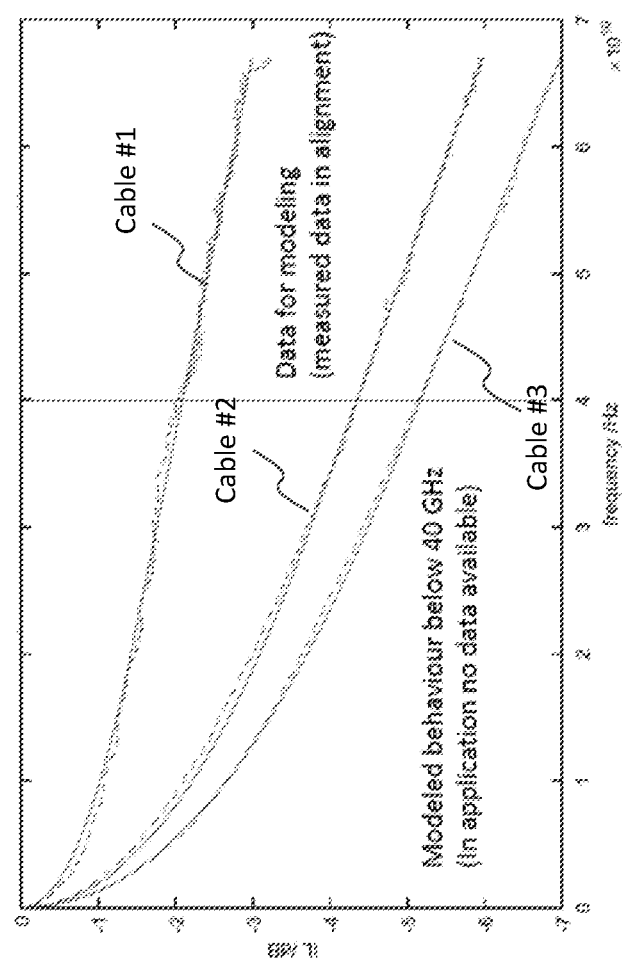
FIG. 3 is simulated results of prediction of insertion loss (IL) of the connection cable according to an embodiment of the present disclosure.

FIG. 3 is simulated results of prediction of insertion loss (IL) of the connection cable according to an embodiment of the present disclosure.

FIG. 3 shows simulation results of IL on three different cables, cable #1, cable #2, and cable #3. Each dashed line represents measured data, and each solid line represents predicted data.

In this simulation, the measured sub-range of the first frequency range is set to 40 GHz-67 GHz. Thus, the insertion loss (IL) of connection cable in unmeasured frequency range is predicted by using a prediction model based on the measured data in frequency range 40 GHz-67 GHz.

As shown in FIG. 3, the predicted IL in unmeasured frequency range is approximately same as the measured data. Therefore, the accuracy of the prediction according to the present disclosure is high enough.

More detailed manner of using prediction model is described with FIG. 4.

FIG. 4 is a simulated result of prediction of insertion loss (IL) of the connection cable in unmeasured frequency range according to an embodiment of the present disclosure.

As shown in FIG. 4, the measured data and predicted data are almost identical.

The prediction is executed in following sequence:

Step 1: fitting a straight line to attenuation value of signal (e.g. insertion loss, IL, of connection cable) in measured frequency range, e.g. sub-range;

In step 1, the insertion loss (IL) is represented as 'S21' (dB). The straight line can be defined using equation 1.

$$S21 = p1*f + p2, \text{ where, } f \text{ is frequency.} \quad \text{[Equation 1]}$$

In this simulation, it is derived that p1 equals to $-6.84e\hat{}(-11)$ and p2 equals to $-2.48$, where the frequency range is 40 GHz-67 GHz.

Step 2: calculating delta (differential) of the IL of signal in the measured frequency range, e.g. sub-range;

In step 2, the delta value, which is differential value, of the IL is calculated in frequency range 40 GHz-67 GHz. In this simulation, the delta value equals to $-5.1-(-6.97)=1.82$ dB/Hz Step 3: estimating IL of signal in unmeasured frequency range, e.g. rest portion of the first frequency range, based on two equations, as shown in equation 3, depending on its frequency range within the unmeasured frequency range, based on the delta value calculated in step 2.

In step 3, s and p are calculated as equation 2.

$$s = \text{Delta}*30e\hat{}9 \text{ [GHz] and } p = p1*s + p2 \quad \text{[Equation 2]}$$

The prediction result of IL can be defined using following equation 3 depending on its frequency range.

$$f < s \quad S21 = p1*f + p2$$

$$f >= s \quad f = [(s*S21)/(-p)]\hat{}(2.1) \quad \text{[Equation 3]}$$

FIG. 5 is a flow chart illustrating a method of operating a test arrangement for adjusting a setup of testing a device under test according to the present disclosure.

In a first step S11, a main device is provided that is configured to generate a RF signal and process an incoming RF signal in a first frequency range.

In a second step S12, a frontend component is provided that is configured to generate a RF signal and process an incoming RF signal in a second frequency range such to perform a test on the DUT throughout the first and second frequency ranges.

In a third step S13, a signal level in a sub-range within the first frequency range is measured by the frontend component, wherein the signal is transmitted via a connection cable for connecting the main device with the frontend component;

In a fourth step S14, a behavior of the connection cable in a rest portion of the first frequency range is predicted by an analyzer, wherein the rest portion of the first frequency range is different from the sub-range within the first frequency range, based on the measured signal level of the sub-range.

In a fifth step S15, a prediction result of the behavior of the connection cable is displayed by a user interface.

It goes without saying that the detailed operation of the test arrangement described with respect to FIG. 1 can also apply to the method of operating the test arrangement.

Although the present invention has been described in the above by way of preferred embodiments, it is not limited thereto, but rather can be modified in a wide range of ways. In particular, the invention can be changed or modified in various ways without deviating from the core of the invention.

LIST OF REFERENCE SIGNS 100 test arrangement
102 main device
104 frontend component
106 connection cable
108 analyzer
110 device under test
202 extender
204 level detector
206 router
208 analyzer
210 user interface
212 database
S11-S15 steps

The invention claimed is:

1. A test arrangement for adjusting a setup of testing a device under test (DUT), the test arrangement comprising:
   a main device configured to generate a RF signal and process an incoming RF signal in a first frequency range;
   a frontend component configured to generate a RF signal and process an incoming RF signal in a second frequency range such to perform a test on the DUT throughout the first and second frequency ranges, wherein the frontend component is configured to measure a signal level in a sub-range within the first frequency range;
   a connection cable for connecting the main device with the frontend component to transmit the RF signal generated by the main device in the first frequency range to the frontend component; and
   an analyzer integrated in or connected to the frontend component, wherein the analyzer is configured to predict a behavior of the connection cable in a rest portion of the first frequency range that is different from the sub-range within the first frequency range, based on the measured signal level of the sub-range.

2. The test arrangement of claim 1, wherein the analyzer is a part of the frontend component.

3. The test arrangement of claim 1, wherein the second frequency range is higher than the first frequency range.

4. The test arrangement of claim 1, wherein the sub-range within the first frequency range is higher range than the rest portion of the first frequency range.

5. The test arrangement of claim 1, wherein the analyzer includes a prediction model for determining the behavior of the connection cable, the prediction model is artificial intelligence model fed with the measured signal level of the sub-range within the first frequency range.

6. The test arrangement of claim 5, wherein the prediction model is configured to predict an attenuation rate of signal in the rest portion of the first frequency range.

7. The test arrangement of claim 5, wherein the prediction model is a digital model.

8. The test arrangement of claim 5, wherein the prediction model is trained over time based on the measured signal level of the sub-range repeatedly.

9. The test arrangement of claim 1, further comprising a user interface coupled to the analyzer, wherein the user interface comprises an input terminal for receiving a user input, wherein the user interface is configured to display a prediction result of the behavior of the connection cable.

10. The test arrangement of claim 9, wherein the prediction result includes at least one of:
    an indication indicating whether the connection cable has a defect;
    an indication indicating whether the connection cable satisfies predefined requirements to be operated;
    information on specification of an alternative connection cable; and
    an estimated accuracy rate of the prediction.

11. The test arrangement of claim 9, wherein the user input includes a desired performance of the connection cable.

12. The test arrangement of claim 11, wherein the prediction result further includes a rate of how much the connection cable fits to the desired performance.

13. The test arrangement of claim 9, wherein the user input includes information of the sub-range within the first frequency range.

14. The test arrangement of claim 9, wherein the frontend component is further configured to correct a configuration of the main device based on the prediction result.

15. The test arrangement of claim 14, wherein the configuration of the main device includes at least one of a frequency, a phase, and an output power level of the main device.

16. The test arrangement of claim 1, further comprising: a database coupled to the analyzer for storing a plurality of connection cables and corresponding specifications of the plurality of connection cables.

17. A method of operating a test arrangement for adjusting a setup for testing a device under test (DUT), the method comprising:
    providing a main device configured to generate a RF signal and process an incoming RF signal in a first frequency range;
    providing a frontend component configured to generate a RF signal and process an incoming RF signal in a second frequency range such to perform a test on the DUT throughout the first and second frequency ranges;
    measuring, by the frontend component, a signal level in a sub-range within the first frequency range that is transmitted via a connection cable for connecting the main device with the frontend component;
    predicting, by an analyzer integrated in or connected to the frontend component, a behavior of the connection cable in a rest portion of the first frequency range different from the sub-range within the first frequency range, based on the measured signal level of the sub-range; and
    displaying, by a user interface, a prediction result of the behavior of the connection cable.

18. A non-transitory computer-readable recording medium, storing instructions executable by a computer processor, causing the computer processor to execute a method of operating a test arrangement for adjusting a setup of testing device under test, comprising:
- providing a main device configured to generate a RF signal and process an incoming RF signal in a first frequency range;
- providing a frontend component configured to generate a RF signal and process an incoming RF signal in a second frequency range such to perform a test on the DUT throughout the first and second frequency ranges;
- measuring, by the frontend component, a signal level in a sub-range within the first frequency range that is transmitted via a connection cable for connecting the main device with the frontend component;
- predicting, by an analyzer integrated in or connected to the frontend component, a behavior of the connection cable in a rest portion of the first frequency range different from the sub-range within the first frequency range, based on the measured signal level of the sub-range; and
- displaying, by a user interface, a prediction result of the behavior of the connection cable.

* * * * *